United States Patent [19]

Biggs et al.

[11] Patent Number: 4,776,088

[45] Date of Patent: Oct. 11, 1988

[54] PLACEMENT ACCURACY GAUGE FOR ELECTRICAL COMPONENTS AND METHOD OF USING SAME

[75] Inventors: Peter M. Biggs, Overland Park, Kans.; Linda K. Dancer, Independence; Simon S. Yerganian, Grandview, both of Mo.

[73] Assignee: The United States of America as represented by the United States Department of Energy, Washington, D.C.

[21] Appl. No.: 119,878

[22] Filed: Nov. 12, 1987

[51] Int. Cl.[4] .................... H05K 3/30; B23Q 17/00
[52] U.S. Cl. ............................ 29/834; 29/407; 29/721
[58] Field of Search .............. 29/827, 834, 564.6, 29/711, 712, 759, 407, 721

[56] References Cited

U.S. PATENT DOCUMENTS

| | | | |
|---|---|---|---|
| 2,906,016 | 9/1959 | Cannon, Jr. et al. | 29/407 |
| 2,959,848 | 11/1960 | Savitt | 29/721 X |
| 3,216,101 | 11/1965 | Miller | 29/407 |
| 3,372,455 | 3/1968 | Howie | 29/721 X |
| 3,581,375 | 6/1971 | Rottmann | 29/759 X |
| 3,667,104 | 6/1972 | Chamillard et al. | 29/721 X |
| 3,713,575 | 1/1973 | Cushman | 29/827 X |
| 4,404,741 | 9/1983 | Lebet et al. | 29/721 |

FOREIGN PATENT DOCUMENTS 2728067 1/1979 Fed. Rep. of Germany ........ 29/720
1023682 6/1983 U.S.S.R. ........................... 29/720

Primary Examiner—Timothy V. Eley
Assistant Examiner—Carl J. Arles
Attorney, Agent, or Firm—Anne D. Daniel; James H. Chafin; Judson R. Hightower

[57] ABSTRACT

Surface mounted electrical components are typically assembled on printed wiring boards by automatic machines. It is important that the machines accurately move with respect to both X and Y rotational axes in order to insure that components are positioned precisely on connector pads of the printed wiring board being assembled. In accordance with the instant invention, a gauge is used to facilitate convenient accuracy checks. The gauge is a glass substrate on which grids of 0.005 inch lines are scribed to form location and orientation fields where components are to be placed. The grids are referenced from either fiducial marks or the edge of the substrate to establish known positions within the grids. The equipment to be evaluated is programmed to place components in known positions and the components are held in place by tacky adhesive that is sprayed on the substrate prior to placing the components. The accuracy of the component position is then compared to the programmed position by placing the substrate on a light table and observing the component location. If a significant inaccuracy with respect to any of the axes exists, the inaccuracy is apparent because the component is not aligned properly with the grid. If a precise measurement of an axis inaccuracy is desired, a measuring microscope may be utilized.

6 Claims, 2 Drawing Sheets

4,776,088

PLACEMENT ACCURACY GAUGE FOR ELECTRICAL COMPONENTS AND METHOD OF USING SAME

The U.S. Government has rights in this invention pursuant to Contract DE-No. AC04-76DP00613 between the U.S. Department of Energy and Allied Corporation.

BACKGROUND OF THE INVENTION

Surface mounted components (SMCs) are placed on printed wiring boards (PWBs) and hybrid micro-circuits (HMCs) by assembly machines that automatically pick the components out of a component feeder and place the components in a desired place on the PWB or HMC. The machines have a machine head that must move accurately with respect to both X, Y and rotational axes in order to properly perform its pick and place tasks.

In accordance with conventional approaches, a laser device is normally used to check positional accuracy of automated placement machinery. However, setup procedures for laser devices are complicated and time consuming. As a result, placement machines cannot be checked routinely for axis positioning inaccuracies. Another disadvantage with checking positional accuracy with a laser is that the laser is used to check the position of machine placement head only. A direct measurement of the positional accuracy of the placed component is not made, thus mechanical inaccuracies occurred during the actual component placement are not measured by the laser system. The net result is that the improperly assembled product itself becomes the indicator that something is wrong with an assembly machine.

The following patents are indicative of the state-of-the-art as revealed in the patent literature: U.S. Pat. Nos. 3,548,493 to Hubbard; 3,621,554 to Feldman et al.; 3,859,723 to Hamer et al.; 3,982,979 to Hentz et al., and 4,403,406 to Foley. Generally, these patents are directed to manufacturing tools for aiding in the assembly of electrical components on a substrate. The patents to Hubbard, Feldman et al. and Foley disclose box-like structures with specialized lighting which assists the operator in locating the correct area on the substrate corresponding to the component to be placed. The lighting systems of Hubbard and Foley also provide methods for assisting an operator in placing components in proper orientation, while the patents to Hamer et al. and Hentz et al. are manufacturing tools which aid an assembler in manually placing small devices (typically less than 0.040") on an electrical substrate. None of the patents solve the problem of evaluating the accuracy of a placement machine prior to actual use of the placement machine so that the placement machine can be properly programmed for a manufacturing run.

SUMMARY OF THE INVENTION

It is an object of the instant invention to provide new and improved apparatus for and methods of checking the accuracy of machines used for automatically positioning components on printed circuit boards.

The instant invention contemplates a placement accuracy gauge for checking the accuracy of a machine which positions discrete electrical components on printed circuit boards wherein the machine utilizes a positioning head for releasably gripping the components, the machine effecting movement of the components and printed circuit boards relative to one another both orthogonally and rotationally. The placement accuracy gauge includes a substrate of transparent material having grid lines thereon and being dimensioned substantially the same as one of the printed circuit boards loaded with electrical components by the machine. The substrate has a surface divided into first, second and third regions. The grid lines in the first region are positioned in a circle divided into segments with each segment having a line therethrough corresponding to non-standard angle of machine rotation, the grid lines in each segment being parallel and perpendicular to the selected angle line. The second region includes an array of grid lines arranged in target areas with each target area including two orthogonal grid lines and two diagonal grid lines with all grid lines intersecting at a common point. The second region further includes an array of fiducial points recognizable by the machine. The third region has a plurality of grid lines arranged orthogonally with respect to one another in a rectangular area. In accordance with the method, the placement. accuracy gauge is placed in the machine; the components placed within the grid area and held thereto by a layer of adhesive, and thereafter the gauge is placed on a light table and the components viewed with respect to the grid areas. It can then readily be determined if the components are correctly or incorrectly placed by comparing their positions with respect to the grid lines.

BRIEF DESCRIPTION OF THE DRAWINGS

Various other objects, features and attendant advantages of the present invention will be more fully appreciated as the same becomes better understood when considered in conjunction with the accompanying drawings, in which like reference characters designate the same or similar parts throughout the several views, and wherein.

DESCRIPTION OF THE PREFERRED EMBODIMENT

Figure 1:
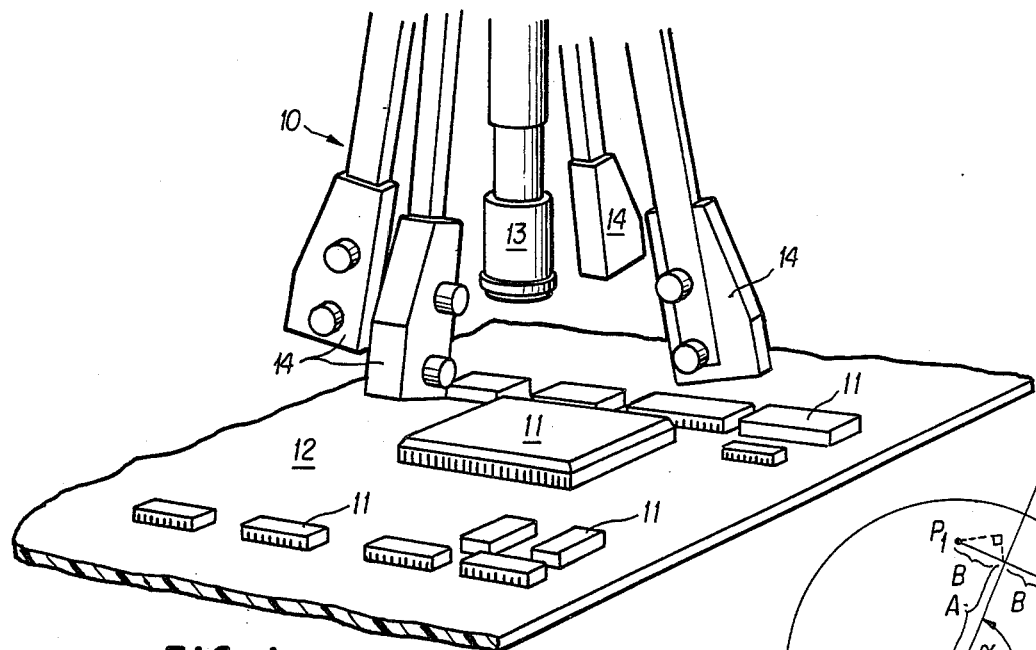
FIG. 1 is a perspective view of a portion of a machine for positioning electrical components on a printed circuit board.

Referring now to FIG. 1, there is shown a portion of an assembly machine, designated generally by the numeral 10 which places electrical components 11, such as integrated circuits, on a printed circuit board 12 by using a vacuum head or chuck 13 and four tweezering arms 14 to grip and maneuver the components. The tweezer actions of the arms 14 provides component centering with respect to the X and Y axes of the machine while the head 13 provides rotational orientation by rotation through 360° in programmable steps in the range of 0.72°. Exemplary of the machine 10 are machines produced by the Emhart Corporation, Model Nos. MPS318 and MPS318EL. Before initiating a production run it is necessary to make sure that the machine 10 is programmed to accurately position components 11. In accordance with the principals of the instant invention, the gauge 20 of FIG. 2 is used for that purpose.

Figure 2:
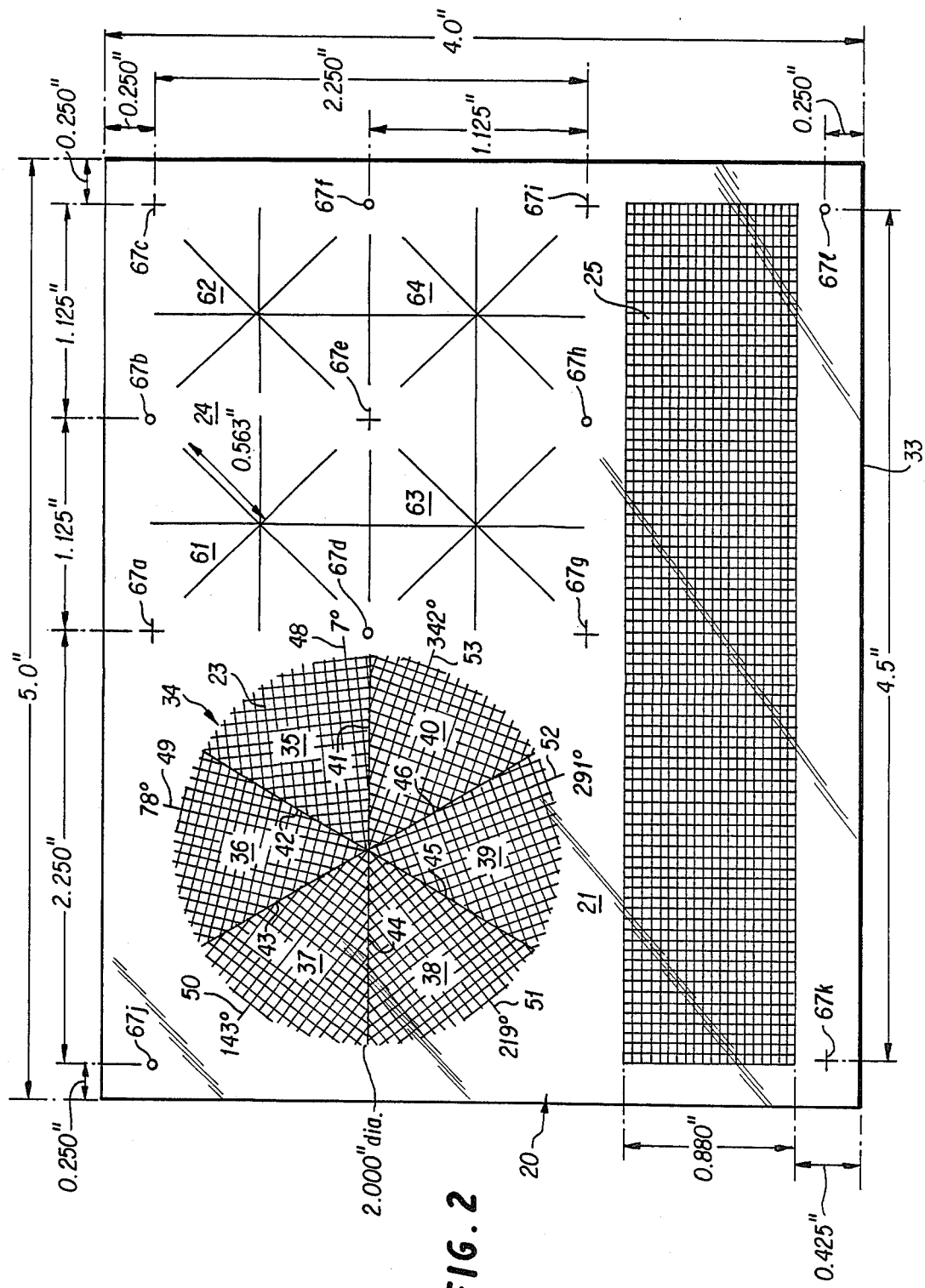
FIG. 2 is a dimensioned top planar view of a glass substrate inscribed with three grid regions in order to provide a gauge in accordance with the principals of the instant invention.

Referring now more specifically to FIG. 2, the placement accuracy gauge 20 is shown with dimensions and comprises grid lines placed on a transparent glass plate 21 which is approximately 0.063 inch thick. The gauge 20 is divided into first, second and third independent regions 23, 24 and 25, respectively. The grid lines in the regions 23, 24 and 25, respectively, are formed by first making a plot of the grids with a photographic plotter which is five times the desired size of the actual gauge 20. The plot is then photographically reduced to the desired size and a master negative of the grids is made. The master negative is positioned on the glass plate 21 and coated with a photosensitive emulsion. The emulsion is then exposed to light through the master. When the emulsion is developed, the areas of the emulsion that were exposed to light remain on the glass in the form of grids. The master negative can be used to expose an unlimited number of glass plates 21. The lines forming the grids are approximately 0.005 of an inch in width and are formed on one side of the transparent glass plate 21. Each square of the grid is approximately 0.050 of an inch by 0.050 of an inch.

To prepare the gauge 20 for use in checking the accuracy of the machine 10, a sprayable adhesive such as an artist adhesive is applied to the same side of the glass substrate 21 on which the grid lines have been printed. This insures that the components 11 are positioned in relatively intimate contact with the grid lines. In lieu of using actual components, precision-machined metal blocks may be utilized. The gauge 20 is then conveyed in the machine 10 in the same manner as a printed circuit board 12 would be conveyed into the machine and the blocks or components 11 are positioned by the chuck head 13 on the adhesive coated side of the glass plate 21. Prior to placement of the components 11, the coordinates for placing the components have been calculated and programmed into the machine computer so that the components are placed in accordance with instructions from the computer.

After the placement accuracy gauge 20 has been loaded with components 11, it is conveyed out of the machine 10. The gauge 20 is then placed on a light table and the positions of the edges of the components 11 are compared to the grid lines. Usually if the angle or position of a component 11 is inaccurate, it will be readily detectable without the aid of magnification. By using a standard measuring microscope, even more accurate measurement of component location can be determined. The placement accuracy gauge 20 can be reused to check accuracy for other arrangements of components 11 by removing the components 11 and then removing the adhesive with an adhesive thinner or turpentine. The same gauge 20 can therefore be used with many different printed circuit boards, since all the gauge does is check the accuracy of the machine 10.

The three independent regions 23, 24 and 25 allow one to quickly check the placement accuracy of the machine 10. The absolute coordinate system corresponds to an origin located at fiducial mark 67$j$ and imaginary X and Y axes. The imaginary X axis is the centerline through fiducial marks 67$j$ 67$a$, 67$b$, and 67$c$. The imaginary Y axis is the centerline through fiducial marks 67$j$ and 67$k$ which fiducial marks are recognizable to the artificial vision system of the machine 10. If a fiducial orientation system is not available with the machine, the location of the pattern can be accurately determined with respect to an edge 33 of the glass plate 20.

Considering now the first region 23, it is seen that the grid is comprised of a two inch diameter circle, designated generally by the number 34, divided into six equal sectors 35, 36, 37, 38, 39 and 40 by six diameter lines 41–46. The sectors 35, 36, 37, 38, 39 and 40 include angle lines 48, 49, 50, 51, 52 and 53 beginning at the center of the circle 34 and extending beyond the parameter of the circle. Each of these lines is at an angle designed to be a non-standard angle of rotation for the head 13 of the machine 10. For example, the lines are at 7°, 78°, 143°, 219°, 291° and 342°, respectively. Within each sector there is a grid COnsisting of lines which are parallel to the angle lines 48–53 and perpendicular to those lines. In each case the angles 7°, 78°, 143°, 219°, 291° and 342° are printed beside the corresponding sector 35–41 within which the angle falls.

Figure 3:
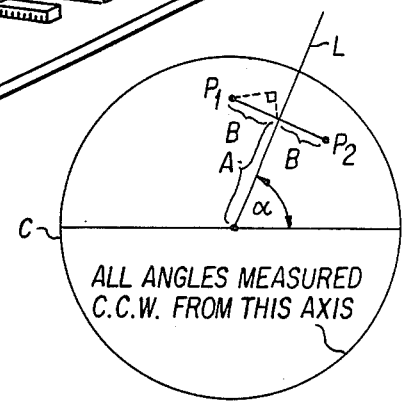
FIG. 3 is a diagrammatical illustration of the method used to find the absolute coordinates of a point in a circular grid forming one region of the gauge.

Location of the absolute coordinates of a point within the grid of the first region 23 is determined by reference to FIG. 3. In FIG. 3 the absolute coordinates of points $P_1$ or $P_2$ (where $P_1$ and $P_2$ are points at the intersections of grid lines) are determined by the following steps:

1. Following the line L which is extended beyond the circle C to center of circle.
2. Counting grid spacings to desired distance A.
3. Counting grid spacings to desired distance B.
4. Using the following formula where:
   B is positive when movement to point P is C.C.W. (increasing angle)
   B is negative when movement to point P is C.W.
   $X = 1.125 + A \cos\alpha - B \sin\alpha$
   $Y = 1.125 - A \sin\alpha - B \cos\alpha$
   $A = (n_A)(0.055)$
   $B = n_B (0.055)$ (increasing angle)
   $B = -n_B (0.055)$ (decreasing angle)
   $n_A$ = counted spacings in direction of A
   $n_B$ = counted spacings in direction of B
   $\alpha$ = angle corresponding to sector (7°, 78°, 291° etc.).

In order to place a component 11 within one of the sectors 35–41 in an orientation relating to the grid lines of that sector, it is required that the component rotate through an angle $\alpha$ combined with movement in the X and Y directions. The angular rotation $\alpha$ for orienting a component 11 within a grid work can be the angle printed beside the corresponding sector or any angle incremental by a positive or negative multiple of 90°. In order to find the absolute coordinates of a point at the intersection of any two grid lines within a sector 35–40, one uses the equations set forth above.

Figure 5:
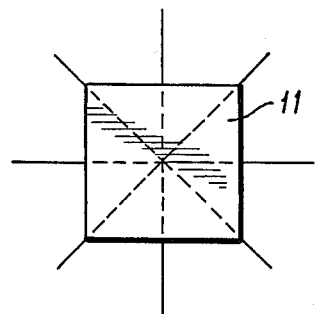
FIG. 5 is a view showing a correctly placed component in the coordinate target region of the gauge.
Figure 6:
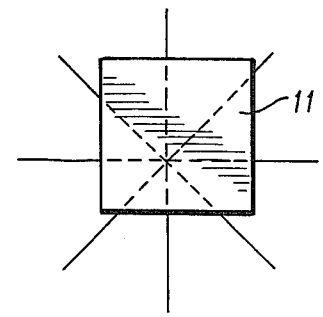
FIG. 6 is a view showing an incorrectly placed component in the coordinate target region of the gauge.

Referring now to the second region 24 it is seen that the second region includes four target areas 61, 62, 63 and 64, each target area having lines parallel to the absolute coordinate axes X and Y and lines at 45°. to those axes. Larger components 11 are placed on these target areas 61–64 either without requiring angular rotation or by using rotation through any positive or negative multiple of 45°. The geometry of the target areas provides a quick reference for square components 11 which if placed properly will have lines bisecting each corner as is shown in FIG. 5. If the square component is improperly placed then it will be readily apparent as is seen in FIG. 6 where the 45° angles do not intersect the corners of the component. Region 24 includes nine fiducial points 67a–67i which can be used for placement of components 11 by machines 10 equipped with artificial vision. The targets are of the same type as those used with the absolute coordinate system.

Figure 4:
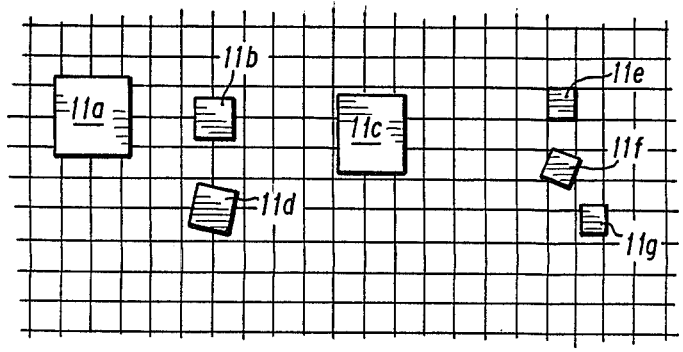
FIG. 4 is an enlarged view of a portion of either the circular region or the rectangular region of the gauge showing both correctly placed and incorrectly placed components.

In order to use the third grid region 25 the coordinates of the point at intersection of the grid lines are determined by the following procedure:
1. Count grid spacings from left edge of grid area.
2. Count grid spacings from bottom edge of grid area.
$X = n_x (0.055)$
$Y = 3.325 - n_y (0.055)$
$n_x$ = counted spacings in x-direction
$n_y$ = counted spacings from bottom edge When the accuracy placement gauge is then placed in the machine 10 and component 11 is applied, whether or not the component 11 is correctly spaced is readily determined by removing the placement accuracy gauge from the machine and placing it on a light table. As is seen in FIG. 4, it can be readily determined if a component is correctly placed. In FIG. 4, the components 11a, 11b and 11e line up with the grid lines and are correctly spaced, whereas the components 11c, 11d, 11f and 11g do not line-up with the grid lines and are incorrectly spaced.

If a placement axis of the machine 10 is inaccurate or malfunctioning, it can be isolated by looking first at the third region 25 to evaluate the X and Y placement accuracy. Rotational placement accuracy is evaluated by examining placement of the component 11 within the two inch circle. The accuracy of each axis can be independently evaluated using the three regions provided upon the gauge 20.

The accuracy placement gauge 20 in accordance with the instant invention has numerous advantages and benefits over previous approaches. The placement accuracy gauge 20 can be used with a variety of components 11 without requiring changes to the gauge. The components 11 may be placed anywhere within the network area of the gauge 20 and the gauge may be placed in an automatic assembly machine 10 in the same manner as an actual printed circuit board 12. The individual axes of movement of the assembly machine 10 may be evaluated independently and the size of the component 11 or position of placement may be changed without altering the gauge 20. The utilization of grid line networks allows for a quick visual determination machine accuracy which if necessary may be precision checked using a measuring microscope.

From the foregoing description, one skilled in the art can easily ascertain the essential characteristics of this invention, and without departing from the spirit and scope thereof, can make various changes and modifications of the invention to adapt it to various usages

What is claimed is:

1. A placement accuracy gauge for checking the accuracy of a machine which positions discrete electrical components on printed circuit boards wherein the machine utilizes a positioning head for releasably gripping the components, the machine effecting movement of the components and printed circuit boards relative to one another both orthogonally and rotationally; the placement accuracy gauge comprising:

a substrate of transparent material having grid lines thereon and being dimensioned substantially the same as one of the printed circuit boards processed by the machine, the substrate having a surface divided into first, second and third regions; the grid lines in the first region being positioned in circle divided into segments with each segment having a line therethrough corresponding to a non-standard angle of machine rotation, the grid lines in each segment being parallel and perpendicular to the selected angle line; the second region including an array of grid lines arranged in target areas with each target area including two orthogonal grid lines and two diagonal grid lines with all grid lines intersecting at a common point, the second region further including an array of fiducial points recognizable by the machine; the third region having a plurality of grid lines arranged orthogonally with respect to one another in a rectangular area; whereby when the placement accuracy gauge is placed in the machine and components are placed within the grid areas and held thereto by a layer of adhesive, or the like, and then thereafter the gauge is placed on a light table and the components viewed with respect to the grid areas, it can readily be determined if the components are correctly or incorrectly placed by comparing their positions with respect to the grid areas.

2. The placement accuracy gauge of claim 1 wherein the gauge is made of glass and the grid areas are inscribed on the same surface that the components are mounted upon.

3. The placement accuracy gauge of claim 2 wherein the grid lines are 0.005 of an inch in width and wherein the spaces defined by the grid are 0.050 of an inch by 0.050 of an inch.

4. The placement accuracy gauge of claim 1 wherein the circle of the first region is approximately 2 inches in diameter, each target area of the second region has a length of 1.25 inches and a width of 1.25 inches and wherein the rectangular region has a length of 4.5 inches and a width of 0.900 of an inch.

5. A method of checking the accuracy of a component placement machine for placing components such as electrical components on a substrate such as a printed circuit board, wherein the components are positioned by a rotatable chuck and wherein the machine effects orthogonal movement of the components and printed circuit board with respect to one another so as to position the components on the printed circuit board in accordance with instructions stored in a computer; the method comprising:

inserting into the machine in place of a printed circuit board a placement accuracy gauge configured as a transparent plate having grid lines thereon, the grid lines being at specific locations on the surface of the gauge with respect to fiducial indicator means on the gauge;

adhering the components to the gauge over the grid lines; and removing the gauge from the machine and placing the gauge on a light table so as to compare the components to the arrays of grid lines visually to determine if the components are properly positioned and oriented on the gauge.

6. The method of claim 5 wherein the components are of different sizes and are arranged on the printed circuit board both in alignment with an X and Y axis and rotationally; the method further including the steps of providing a first array of grid lines in first region for components which are rotated prior to positioning on the board; providing a second array of grid lines for components which are relatively large in area, and providing a third array of grid lines for relatively small components which are not rotated but ar oriented with sides parallel to orthogonal axes.

* * * * *